United States Patent [19]

Totsuka et al.

[11] Patent Number: 4,659,228

[45] Date of Patent: Apr. 21, 1987

[54] ALIGNING APPARATUS

[75] Inventors: Masao Totsuka, Ohmiya; Akiyoshi Suzuki, Tokyo, both of Japan

[73] Assignee: Canon Kabushiki Kaisha, Tokyo, Japan

[21] Appl. No.: 774,167

[22] Filed: Sep. 9, 1985

Related U.S. Application Data

[63] Continuation of Ser. No. 438,628, Nov. 2, 1982, abandoned.

[30] Foreign Application Priority Data

Nov. 12, 1981 [JP] Japan ............................... 56-181315

[51] Int. Cl.$^4$ ............................................. G01B 11/00
[52] U.S. Cl. .................................... 356/401; 250/548; 356/400
[58] Field of Search ................................ 356/399–401, 356/375; 250/548, 557, 561; 353/53; 350/6.1, 254, 382, 401, 420, 422, 433

[56] References Cited

U.S. PATENT DOCUMENTS

| | | | |
|---|---|---|---|
| 3,388,650 | 6/1968 | Westphalen | 350/422 |
| 3,398,918 | 8/1968 | Girault | 350/420 |
| 3,495,891 | 2/1970 | Lee | 350/420 |
| 3,704,997 | 12/1972 | Smith | 350/401 |
| 3,825,316 | 7/1974 | Amodei | 350/401 |
| 4,199,219 | 4/1980 | Suzki et al. | 350/6.1 |
| 4,277,178 | 7/1981 | Cushing et al. | 356/431 |
| 4,278,893 | 7/1981 | Kato et al. | 356/401 |
| 4,423,959 | 1/1984 | Nakazawa et al. | 356/401 |
| 4,531,060 | 7/1985 | Suwa et al. | 356/400 |

OTHER PUBLICATIONS

Jenkins and White, "Fundamentals of Optics" p. 245.

*Primary Examiner*—F. L. Evans
*Attorney, Agent, or Firm*—Fitzpatrick, Cella, Harper & Scinto

[57] ABSTRACT

Disclosed is an aligning apparatus in which two bodies such as a semiconductor mask and a wafer having elongate (or bar-like) alignment marks are scanned by a bar-like beam having an elongate irradiating area and further scanned by the bar-like beam with the direction of inclination thereof changed, and the positional relation between the two bodies is detected, whereby alignment of the two bodies is achieved. The bar-like beam is formed by an anamorphic optical system (for example, a cylindrical lens or the like). The bar-like beam scans the alignment marks through a beam scanning system, and the inclination of the beam is changed by beam inclination changing element at a desired time, for example, after the first cycle of scanning has been terminated, and then scanning is effected again.

15 Claims, 10 Drawing Figures

ALIGNING APPARATUS

This application is a continuation of application Ser. No. 438,628 filed Nov. 2, 1982, now abandoned.

BACKGROUND OF THE INVENTION

1. Field of the Invention

This invention relates to an apparatus which accomplishes alignment and further, automatic alignment, of the mutual positions of two bodies such as a mask and a wafer.

2. Description of the Prior Art

In an apparatus such as a semiconductor printing apparatus wherein two or more kinds of masks are used to effect printing on wafers in succession, the order of micron or submicron is required of the alignment accuracy of the mask and wafer in view of the tendency of elements toward minuteness. Such work has heretofore been carried out by skilled operators, but much time and labor have been involved in such work and automation of the work has been desired and recently has been put into practical use.

Under such circumstances, the enhancement of the accuracy and efficiency in the automatic alignment for mask and wafer is an important theme.

An aligning apparatus is disclosed in U.S. Pat. No. 3,683,195. In this apparatus, a mask and wafer having alignment marks are disposed in a superposed relation and these alignment marks are scanned to detect the positional relation between the alignment marks, thereby detecting the positional relation between the mask and wafer. The alignment marks of the mask are of the double cross type configuration in which first and second bars which are in parallel relationship are intersected at an angle of 90° by third and fourth bars which are also in parallel relationship, and the alignment marks of the wafer are of such configuration in which fifth and sixth bars intersect each other at an angle of 90°.

The scanning of these alignment marks is effected by a movable opening disposed at the enlarged image position. This movable opening is in the form of a slit to increase the level of the detection signal.

Since the movable opening is in the form of a slit, two slit-like openings which are in orthogonal relationship are necessary for detecting the intersecting bars. The positional relation between the marks in a certain direction is detected by one slit, and the positional relation between the marks in a direction perpendicular to said certain direction is detected by the other slit.

However this conventional optical apparatus has required the provision of a plurality of slits when the problem of the quantity of light is taken into consideration, and the provision of the plurality of slits has led to complication of the optical system.

Also, the illuminating light for detection illuminates the entire area of an object to be observed and the light from a part thereof is detected by a photodetector and thus, only part of the illuminating light contributes to the detection and the illuminating light has not been effectively utilized.

There is another example of the apparatus in which the object surface is scanned by a spot. This apparatus has suffered from the disadvantage that failure of alignment or aggravation of accuracy occurs when dust is present on the scanning line or when alignment marks fall off.

SUMMARY OF THE INVENTION

It is an object of the present invention to overcome the above-noted disadvantages peculiar to the prior art, to provide a simple optical system, to achieve effective utilization of the illuminating light and to enable highly accurate and efficient positioning.

According to one aspect of the present invention, a bar-like beam having an elongate irradiating area (the width of the bar may be wide or narrow) scans two bodies such as a semiconductor mask and a wafer having bar-like alignment marks.

According to another aspect of the present invention, bar-like beams differing in direction of inclination scan bar-like alignment marks different in direction of inclination to scan two bodies.

According to a further aspect of the present invention, there is provided an aligning apparatus having means for rotating at least a part of an anamorphic optical system in a plane perpendicular to the optical axis, or means for changing over at least a part of the anamorphic optical system into another anamorphic optical system, or means for changing over the optical path to a different anamorphic optical system provided in an optical path divided by a beam splitter.

According to a further aspect, a bar-like beam is generated by an anamorphic optical system, and the inclination of the bar-like beam is changed by beam inclination changing means at a desired time, for example, after the first cycle of scanning has been terminated.

The two bodies are not restricted to a semiconductor mask and a wafer but may be other objects, and the present invention is also applicable, for example, to the alignment of negatives for printing.

The invention will become more fully apparent from the following detailed description thereof taken in conjunction with the accompanying drawings.

DESCRIPTION OF THE PREFERRED EMBODIMENTS

Figure 1:
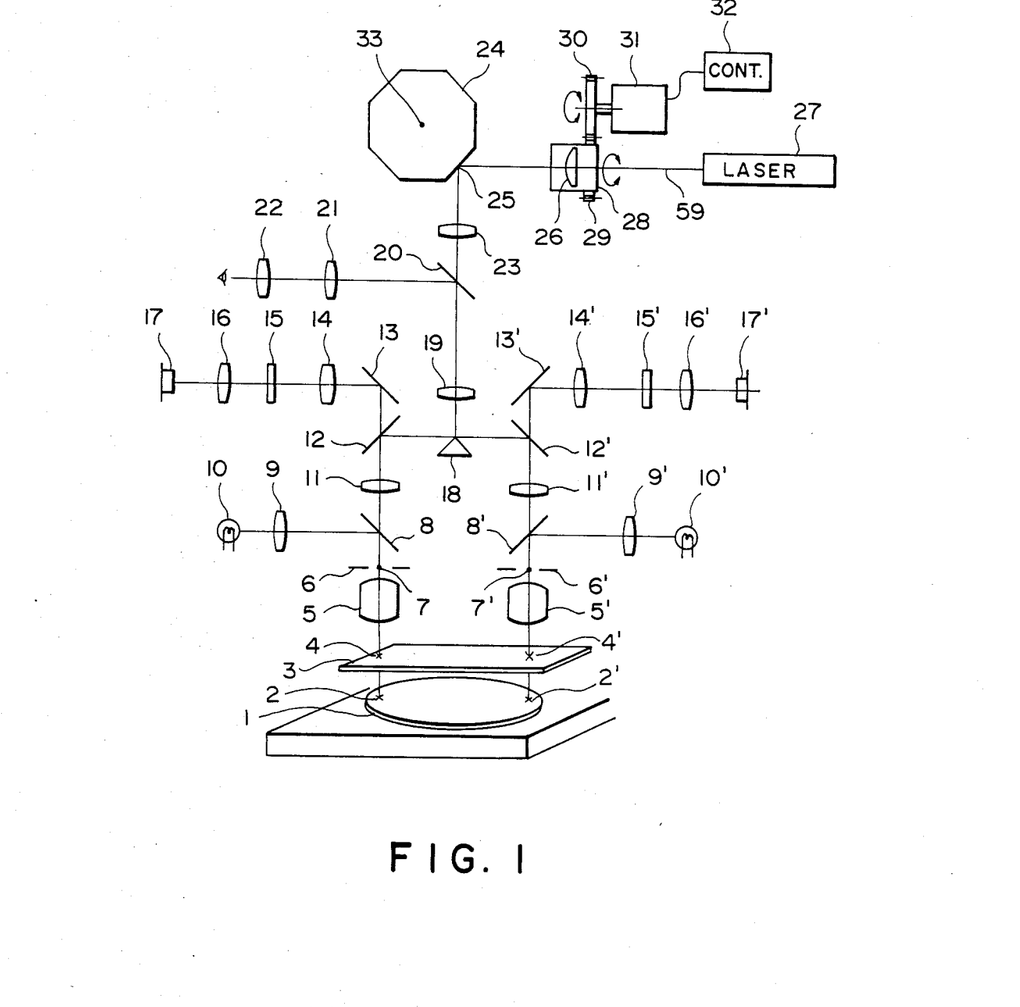
FIG. 1 shows the optical arrangement of the automatic aligning apparatus of the present invention.
Figure 3:
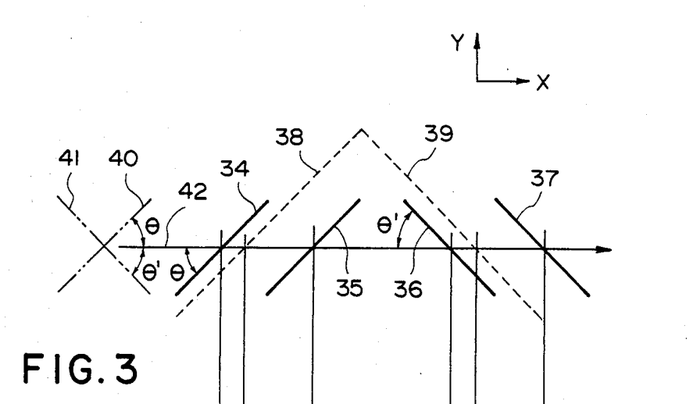
FIG. 3 shows alignment marks.

Referring to FIG. 1 which shows an embodiment of the present invention, reference numeral 1 designates a wafer and reference numeral 3 denotes a mask. Reference numerals 2 and 4 indicate the respective positions of the wafer and mask to which a beam is applied. Bar-like alignment marks inclined by 45° with respect to the scanning line as indicated by reference numerals 38 and 39 in FIG. 3 are provided on the wafer 1. Also, bar-like alignment marks inclined by 45° with respect to the scanning line as indicated by reference numerals 34, 35, 36 and 37 in FIG. 3 are provided on the mask 3. Of course, these marks may be microscopically bar-like and may comprise an aggrate of dots or small square pieces.

Turning back to FIG. 1, reference numeral 27 designates a coherent light source, i.e., a laser. Reference numeral 24 denotes a rotational polygon mirror rotatable about a rotary shaft 33. Of course, the rotational polygon mirror 24 may be replaced by other optical element such as, for example, a galvano mirror or an acousto-optical element. Reference numerals 11, 19 and 23 designate intermediate lenses. Reference numeral 5 denotes a telecentric objective lens. The intermediate lenses 11, 19 and 23 form the deflection origin 25 (namely, vibration origin) of the deflected light from the rotational polygon mirror 24 at 7 in the pupil position 6 of the objective lens 5. Accordingly, the laser beam scans the mask and wafer by rotation of the rotational polygon mirror. Reference numeral 8 designates a half-mirror forming an illuminating system 9, 10 for a visual observation system, reference numeral 9 denotes a condenser lens, reference numeral 10 designates a lamp, reference numeral 18 denotes an optical path dividing mirror, reference numeral 20 designates a half-mirror forming part of the visual observation system 21, 22, and reference numeral 21 denotes a lens which cooperates with the lenses 5, 11, 19 to form images of the mask 3 and wafer 1. Reference numeral 22 designates an eyepiece. Reference numeral 12 denotes a half-mirror forming part of a photoelectric detecting system 13-17. Reference numeral 13 designates a mirror and reference numeral 14 denotes a lens which cooperates with the lens 11 to re-form a vibration origin image 7. Reference numeral 15 designates a space filter having a light-intercepting portion of a size as large as the vibration origin image. Accordingly, this filter 15 has a nature which intercepts the light from a portion having no edge of a pattern and transmits the scattered light from the pattern edge. Reference numeral 16 denotes a condenser lens and reference numeral 17 designates a photodetector. Reference numeral 26 denotes a cylindrical lens which forms the laser beam into a bar-like beam in which the irradiating region is elongate as shown at 40 or 41 in FIG. 3. A good result will be obtained if the line width and length of the beam are of the same degree as those of the alignment marks. Designated by 28 is a cylindrical lens housing. Reference numerals 29 and 30 denote gears. The gear 29 is fixed to the cylindrical lens housing 28. Reference numeral 31 designates a rotational type actuator such as, for example, a step motor. Designated by 32 is the control system of the step motor 31.

Accordingly, the elongate bar-like beam is rotatable in any direction in a plane orthogonal to the optical axis by the instruction of the control system. Primed numbers designate members disposed symmetrically and these members need not be described.

Figure 4:
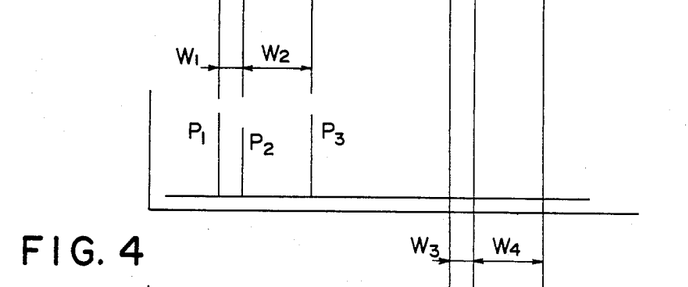
FIGS. 4 and 5 show the reading signals of the alignment marks of FIG. 3.

Operation of the alignment apparatus of FIG. 1 will hereinafter be described. Assume that the alignment marks on the mask 3 and wafer 1 are arranged as shown in FIG. 3. Designated by 42 is a scanning axis. Assume that the alignment marks 34, 35 and 36, 37 on the mask are preset so that they are pairwise parallel to each other and inclined by $\theta$ and $\theta'$, respectively, with respect to the scanning axis 42. The cylindrical lens 26 is rotated by a certain amount by the instruction of the control system 32 via the gears 29 and 30 and has an inclination of $\theta$ with respect to the scanning axis as shown in the scanning beam 40. The output of the photodetector when scanning is effected in this condition is as shown in FIG. 4. That is, $P_1$-$P_3$ are signals corresponding to the alignment marks 34, 38 and 35, respectively. Also, even if there is minute dust on the scanning surface, these signals are averaged unlike the case of a spot-like beam and therefore, they are detected as the output in practice. The outputs from the sides differing in inclination, namely, the portions of the alignment marks 36, 39 and 37 shown in FIG. 3, can be practically neglected.

Figure 5:
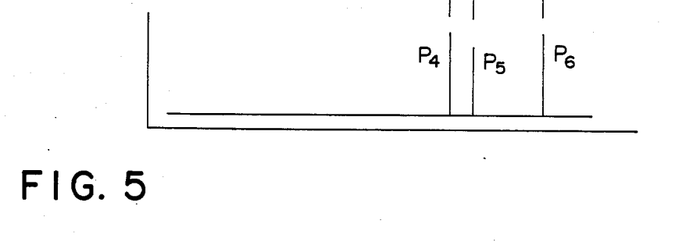
Figure 6:
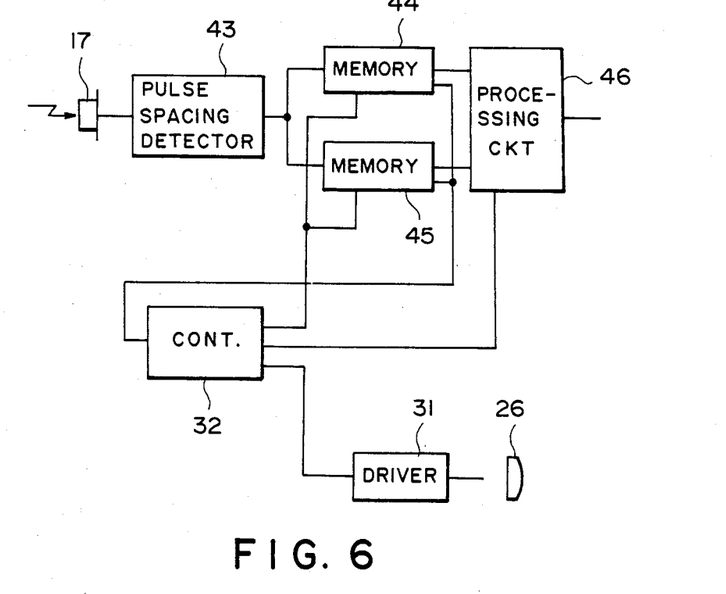
FIG. 6 is a block diagram of the signal processing circuit in the automatic aligning apparatus of the present invention.

This signal is input to a pulse spacing detector circuit 43, as shown in FIG. 6. This circuit has a whisker pulse generator and starts to count the whisker pulses by a scanning pulse signal and stops counting the whisker pulses by the next scanning pulse signal, thereby measuring the spacing between the pulses. The measured values $W_1$ and $W_2$ (FIG. 3) of the pulse spacing are supplied to a memory 44 in accordance with the instruction of the control system 32 and held therein. The above-described measurement data is set and repeated until n sets of data instructed by the control system 32 are introduced. When the n sets of data are introduced, the control system 32 instructs the drive source 31 to rotate the cylindrical lens 26 by 90° in this example. Thereupon, the scanning beam is arranged as shown at 41 in FIG. 3 and starts scanning. The output of the photodetector in this case is as shown in FIG. 5. The signal is likewise supplied to the pulse spacing measuring circuit 43, from which measured values $W_3$ and $W_4$ are supplied to a memory 45 in accordance with the instruction of the control system 32 and held therein. Thereafter, n sets of data are likewise introduced. When a predetermined number of sets of measurement data $W_1$-$W_4$ are introduced, the control system 32 supplies the data to an operational circuit 46 to cause it to calculate the amount of deviation between the alignment marks of the mask and wafer, i.e., the amount of deviation between the mask and the wafer.

The amount of deviation between the mask and the wafer can be expressed by:

$$\text{Amount of deviation in } X\text{-direction} = \frac{W_1 - W_2 - W_3 + W_4}{4}$$

$$\text{Amount of deviation in } Y\text{-direction} = \frac{-W_1 + W_2 - W_3 + W_4}{4}$$

In the foregoing, description has been made of one of two axes on the mask and wafer, and similar processing is also effected with respect to the other axis, whereby the amounts of deviation in X-direction and Y-direction are detected. Therefrom, the deviation in $\theta$ direction is detected as the difference between the deviations in left and right Y-directions.

Figure 2:
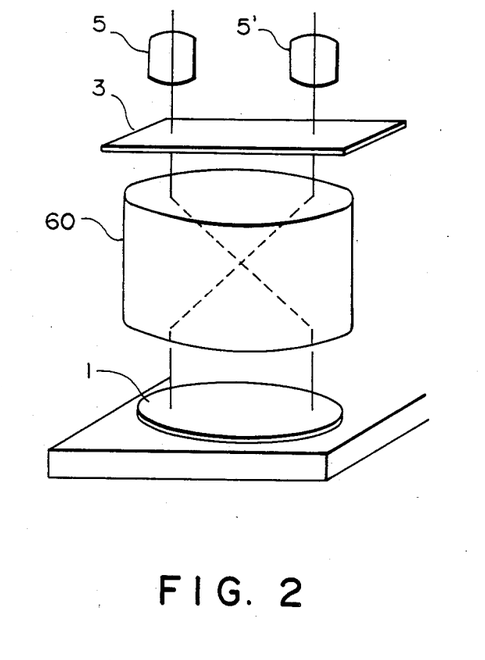
FIG. 2 shows a part modification of the optical arrangement of FIG. 1.

From the above-described amounts of deviation in X-, Y- and $\theta$-directions, the mask or the wafer is moved relative to each other by a conventional XY$\theta$ alignment mechanism, not shown, whereby the mask and wafer are aligned. In FIG. 1, for better understanding, the mask 3 and wafer 1 are shown as being spaced apart from each other, but actually they are in proximity to each other. Alternatively, as shown in FIG. 2, the mask 3 and wafer 1 may be spaced apart from each other and a projection system 60 may be disposed therebetween. The magnification ratio of the projection system does not matter.

Some modifications will now be described. The examples shown in FIGS. 7-10 are modifications of the mechanism for rotating the scanning beam indicated by 26-31 in FIG. 1 which shows the first embodiment, by a predetermined angle in a plane orthogonal to the optical axis. In the other points, these modifications are similar to the first embodiment.

In the first embodiment, the inclinations θ and θ' of the scanning beam can be changed as desired relative to the scanning axis, whereas the feature of these examples is that the scanning beam is movable only in the ranges of the initially set inclinations θ and θ' but the driving method is simple.

Figure 7:
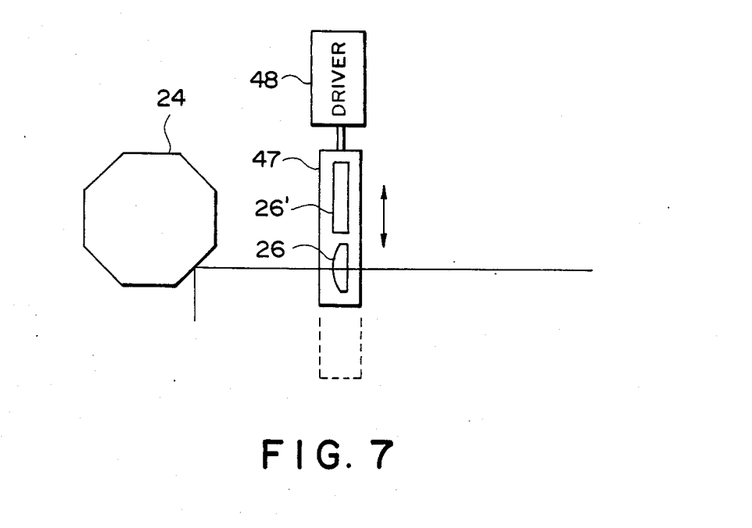
FIGS. 7 to 10 show modifications of the linear image forming portion of FIG. 1.

Referring first to FIG. 7, reference numeral 24 designates a rotational polygon mirror and reference numerals 26 and 26' denote cylindrical lenses of the same specification. The cylindrical lenses 26 and 26' are preset such that the scanning beam assumes predetermined inclinations θ and θ' relative to the scanning axis, as shown in FIG. 3. Reference numeral 47 designates a holder, and reference numeral 48 denotes a conventional drive source for rectilinearly moving the cylindrical lenses 26 and 26' in a direction orthogonal to the optical axis, such as, for example, a cylinder or a linear motion solenoid. The stroke of the linear movement is limited by a stopper, not shown, so that the cylindrical lenses are registered to the predetermined optical axis.

Of course, the drive source 48 is operated by the control of the control system 32 shown in FIG. 1, as in the first embodiment.

Accordingly, the drive source is operated by the instruction of the control system 32, and the cylindrical lenses are changed over so that the scanning beam is set to 40 or 41 as shown in FIG. 3.

Figure 8:
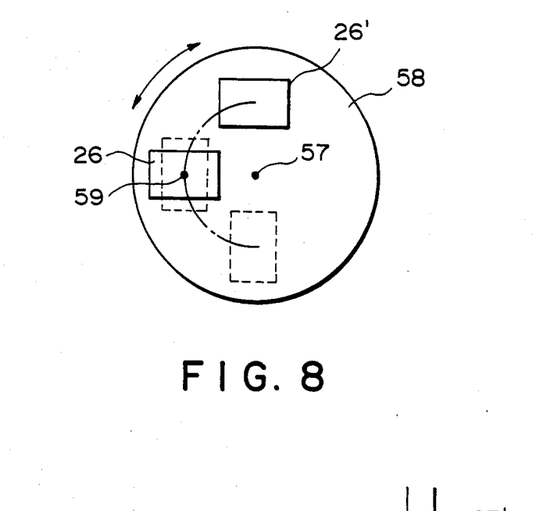

In the example shown in FIG. 8, cylindrical lenses 26 and 26' of the same specification are disposed in a predetermined angular relationship at the predetermined position of a holder 58 having a rotational axis 57, namely, on an imaginary circle centered on the rotational axis 57. In accordance with the instruction of the control system 32, the cylindrical lenses 26 and 26' are rotated by the action of a conventional drive source, for example, a rotary solenoid, and a rotation limiting stopper, both not shown, so as to be registered to the optical axis 59. Since the cylindrical lenses 26 and 26' on the optical axis 59 are in the predetermined angular relationship, the scanning beam is set to 40 or 41 shown in FIG. 3. In the other points, this example is similar to the first embodiment.

Figure 9:
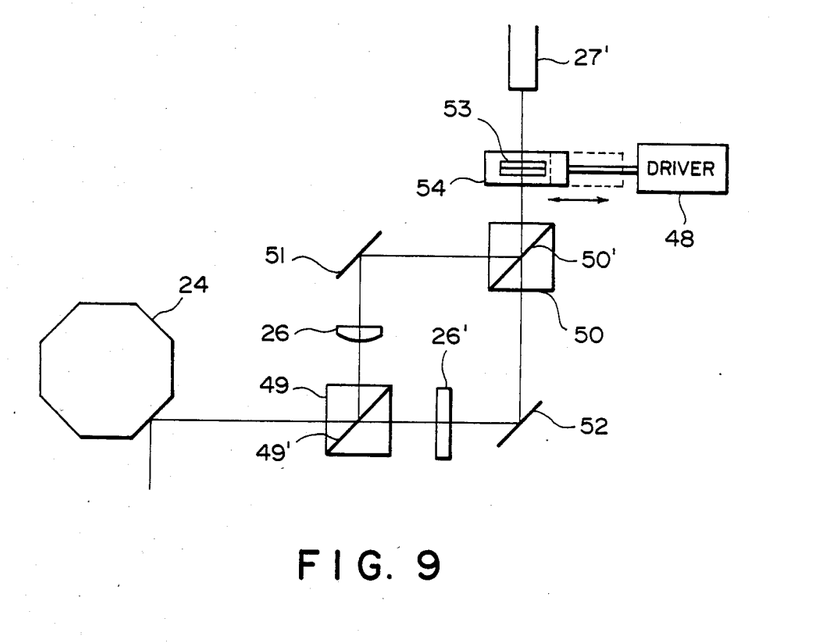

Another embodiment is shown in FIG. 9. In the embodiment of FIG. 9, cylindrical lenses 26 and 26' are disposed in a predetermined angular relationship in a plane orthogonal to the optical axis. Reference numerals 51 and 52 designate mirrors, and reference numerals 49 and 50 denote polarizing beam splitters having a nature of reflecting or transmitting light depending on the direction of polarization.

Reference numeral 54 designates a holder, reference numeral 48 denotes a rectilinear movement drive source discribed in connection with the example of FIG. 6, and reference numeral 27' designates a polarization type laser.

Assume that the laser 27' is a polarized light in the direction in the plane of the drawing sheet. This is called the P polarized light. When it enters a λ/2 plate 53, the P polarized light changes into S polarized light perpendicular to the plane of the drawing sheet and is totally reflected by the reflecting surface 50' of the polarizing beam splitter 50. The S polarized light then enters the cylindrical lens 26 via the mirror 51, whereby it is shaped into a bar-like beam. Subsequently, it is totally reflected by the reflecting surface 49' of the polarizing beam splitter 49 and travels toward the rotational polygon mirror 24. An instruction is sent from the control system 32 to the drive source 48 and, when the λ/2 plate 53 is retracted out of the optical path, the laser beam enters the beam splitter 50 while remaining to be P polarized light and is totally transmitted therethrough conversely to the previous case. Then it goes via the mirror 52 and is shaped into a bar-like beam by the cylindrical lens 26', and is totally transmitted through the beam splitter 49 similarly to the previous case and travels toward the rotational polygon mirror 24.

In short, the optical path can be changed without any loss of the quantity of light by the changeover of the λ/2 plate 53 and as a result, the direction of rotation of the bar-like beam in a plane orthogonal to the optical axis can be changed into a predetermined direction as shown at 40 or 41 in FIG. 3.

In this example, the λ/2 plate can be replaced by other optical elements such as, for example, an electro-optical element and in that case, the rectilinear drive source 48 is unnecessary and thus, the construction will become simpler.

Figure 10:
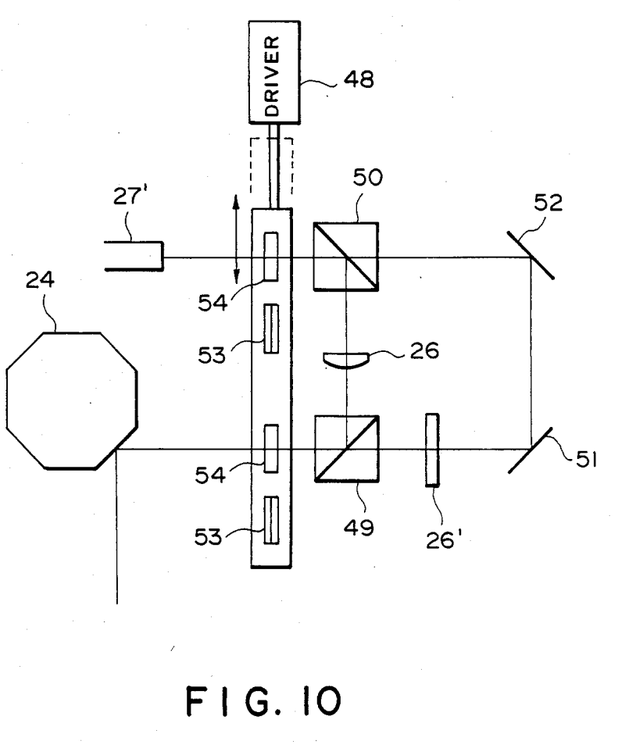

The example of FIG. 10 is substantially similar to the example of FIG. 9 with the exception that an optical path length correcting glass 54 is provided and that another λ/2 plate 53 is provided so that the beams having passed via two optical paths are identical in direction of polarization. Accordingly, this example is effective in a case where the length of the optical path must be corrected and the direction of polarization of the beam must be made constant.

As described above, the present invention has overcome the disadvantages attributable to the facts that use is made of a complicated optical system which is a shortcoming of the prior art, that the illuminating light is not effectively utilized and that use is made of the spot beam scanning seen in other examples of the apparatus, that is, the disadvantages that failure of alignment or aggravation of accuracy may occur in case dust is present on the scanning line or alignment marks fall off, by the use of bar-like beam generating means comprising a simple optical element and means for changing the scanning bar-like beam into a desired inclination at a desired time during the scanning of alignment marks. Although description has been made of examples using cylindrical lenses, the bar-like beam can be formed by using a usual anamorphic optical system (namely, an optical system in which the refractive power in one direction differs from the refractive power in a direction orthogonal to said one direction). As an example of the anamorphic optical system, an optical system comprising a combination of a cylindrical lens and a spherical lens would occur to mind.

Thus, effective utilization of a simple optical system and illuminating light and enhancement of alignment accuracy and alignment possibility rate have been realized. That is, the rate taken by dust and incomplete portions such as fall-off of alignment marks is reduced and more complete signal can be obtained, whereby enhancement of alignment accuracy and alignment possibility rate has been achieved.

Further, the realization of the effective utilization of the illuminating light, coupled with the adaption of the laser light source, is highly effective for the enhancement of the rate at which automatic alignment is achieved. That is, from the relation that if the other conditions are fixed, the magnitude of the signal from the scanning surface is proportional to the quantity of light supplied per unit area, converging the entire illuminating light beam into a bar-like beam means that a sufficiently great signal for automatic alignment can be supplied even from a body such as a wafer from which it is difficult to obtain a signal and the rate of success of automatic alignment is enhanced. Conversely speaking, a smaller light source is enough to obtain a predetermined signal output and this leads to a reduction in power consumption and compactness of the apparatus.

Also, when viewed from the viewpoint of alignment accuracy, the stability of the scanning device, namely, the stability of the scanning speed, becomes a great problem and any error of the stability may lead to reduced alignment accuracy. In respect of this point, in the present invention, a rotational polygon mirror, a galvano mirror or an acousto-optical element is employed as the scanning body and therefore, it is structurally easy to maintain the stability of the scanning speed and as a result, enhancement of alignment accuracy can be achieved.

What we claim is:

1. An aligning apparatus for achieving a predetermined positional alignment of two bodies by scanning first and second bar-like alignment marks provided thereon which are inclined in first and second directions, respectively, relative to a single scanning line, said first and second directions differing from each other, said apparatus comprising:
   beam generating means for sequentially generating two kinds of bar-like beams which are inclined in said first and second directions, respectively, relative to the scanning lines;
   beam scanning means for scanning said bar-like beams along the scanning line;
   means for detecting said bar-like marks, said detecting means outputting first signals corresponding to said first bar-like marks provided on said two bodies when said bar-like beam inclined in said first direction is scanned along the scanning line and outputting second signals corresponding to said second bar-like marks provided on said two bodies when said bar-like beam inclined in said second direction is scanned along the scanning line;
   means for discriminating an amount of deviation between said two bodies based on said first and second signals; and
   means for moving at least one of said two bodies relative to the other body in accordance with the amount of deviation discriminated by said discriminating means to achieve the predetermined positional alignment of said two bodies.

2. An aligning apparatus according to claim 1, wherein said beam generating means comprises changing means for interchanging between two conditions in one of which said bar-like beam inclined in said first direction can be generated and in other of which said bar-like beam inclined in said second direction can be generated.

3. An aligning apparatus according to claim 1, wherein each said bar-like beam is about the same as one said bar-like mark in its width and length.

4. An aligning apparatus according to claim 1, wherein said beam generating means comprises a beam source, an anmorphic optical system for changing the beam from the beam source to the bar-like beam and means for rotating the anamorphic optical system.

5. An aligning apparatus according to claim 1, wherein said beam generating means comprises a beam source, a first anamorphic optical system for changing the beam from the beam source to the bar-like beam inclined in the first direction relative to the scanning line, a second anamorphic optical system for changing the beam from the beam source to the bar-like beam inclined in the second direction relative to the scanning line and means for selectively causing the beam from the beam source to pass through one of the first and second anamorphic optical systems.

6. An aligning apparatus according to claim 5, wherein said causing means movably supports said first and second anamorphic optical systems to position one of said first and second anamorphic optical systems in the optical path of the beam from said beam source.

7. An aligning apparatus according to claim 5, wherein said beam source generates a polarized beam and said causing means comprises a $\lambda/2$ plate selectably mountable in the optical path of the beam from said beam source for changing a direction of polarization of the beam from said beam source and a polarizing beam splitter for directing the beam from said beam source to one of said first and second anamorphic optical systems depending upon the selective mounting of said $\lambda/2$ plate in the optical path.

8. An aligning apparatus according to claim 7, wherein said causing means movably supports the $\lambda/2$ plate and an optical glass, the optical thickness of which is equal to that of the $\lambda/2$ plate, to position of the $\lambda/2$ plate and the optical glass in the optical path of the beam from the beam source.

9. An aligning apparatus according to claim 7, wherein said beam generating means comprises a $\lambda/2$ plate for coinciding a direction of polarization of the beam from the first anamorphic optical system with that of the beam from the second anamorphic optical system.

10. An aligning apparatus according to claim 1, wherein said beam generating means comprises a beam source, a plurality of cylindrical lenses the directions of generatrices of which are different from each other, and means for selectively positioning one of said cylindrical lenses in the optical path of the beam from said beam source.

11. An aligning method for achieving a predetermined positional alignment of two bodies by scanning first and second bar-like alignment marks provided thereon which are inclined in first and second directions, respectively, relative to a single scanning line, said first and second directions differing from each other, comprising the steps of:
   sequentially generating two kinds of bar-like beams which are inclined in said first and second directions, respectively, relative to the scanning line;
   obtaining first signals corresponding to said first bar-like marks provided on said two bodies by scanning the bar-like beam inclined in said first direction along the scanning line;
   obtaining second signals corresponding to said second bar-like marks provided on said two bodies by scanning the bar-like beam inclined in said second direction along the scanning line;
   discriminating an amount of deviation between said two bodies based on said first and second signals; and
   moving at least one of said two bodies relative to the other body in accordance with the amount of deviation to achieve the predetermined positional alignment of said two bodies.

12. An aligning method according to claim 11, wherein generations of said two kinds of bar-like beams are in turn carried out sequentially.

13. An aligning method according to claim 12, wherein the interchanging between generations of said two kinds of bar-like beams is carried out during the period from the ending of one scanning to the commencing of another scanning which follows said one scanning.

14. An aligning method according to claim 12, wherein a plurality of scannings of the bar-like beam inclined in said first direction are carried out and a plurality of scannings of the bar-like beam inclined in said second direction are carried out.

15. An aligning method according to claim 14, wherein the scannings of the two kinds of bar-like beams are carried out the same plurality of times, respectively.

* * * * *